(12) United States Patent
Hart

(10) Patent No.: US 8,261,229 B2
(45) Date of Patent: Sep. 4, 2012

(54) METHOD AND APPARATUS FOR INTERCONNECT LAYOUT IN AN INTEGRATED CIRCUIT

(75) Inventor: Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 212 days.

(21) Appl. No.: 12/696,743

(22) Filed: Jan. 29, 2010

(65) Prior Publication Data

US 2011/0191729 A1 Aug. 4, 2011

(51) Int. Cl.
*G06F 9/455* (2006.01)
*G06F 17/50* (2006.01)

(52) U.S. Cl. ........................................ 716/137; 716/132

(58) Field of Classification Search .................. 716/132, 716/137
See application file for complete search history.

(56) References Cited

U.S. PATENT DOCUMENTS

| | | | |
|---|---|---|---|
| 6,043,429 A | 3/2000 | Blish, II et al. | |
| 6,531,759 B2 | 3/2003 | Wachnik et al. | |
| 7,276,435 B1* | 10/2007 | Pozder et al. | 438/597 |
| 7,698,679 B2* | 4/2010 | Rizzo et al. | 716/126 |
| 2006/0154470 A1* | 7/2006 | Pozder et al. | 438/618 |
| 2007/0013073 A1 | 1/2007 | Cabral, Jr. et al. | |
| 2007/0123009 A1* | 5/2007 | Richter et al. | 438/479 |
| 2007/0210442 A1* | 9/2007 | Hess et al. | 257/700 |
| 2009/0181314 A1* | 7/2009 | Shyu et al. | 430/5 |
| 2011/0115073 A1* | 5/2011 | Chen | 257/737 |
| 2011/0175211 A1* | 7/2011 | Cabral et al. | 257/660 |

OTHER PUBLICATIONS

Tang, Henry H. K. et al., "Importance of BEOL Modeling in Single Event Effect Analysis," *IEEE Transactions on Nuclear Science*, Dec. 1, 2007, pp. 2162-2167, vol. 54, No. 6, IEEE Service Center, New York, New York, USA.

Zhang, Wangyuan et al., "Microarchitecture Soft Error Vulnerability Characterization and Mitigation under 3D Integration Technology," *Proc. of the 41st IEEE/ACM International Symposium on Microarchitecture*, Nov. 8, 2008, pp. 435-446, IEEE, Piscataway, New Jersey, USA.

* cited by examiner

*Primary Examiner* — Suresh Memula
(74) *Attorney, Agent, or Firm* — Robert M. Brush; LeRoy D. Maunu; John J. King

(57) ABSTRACT

An embodiment of the invention relates to a computer-implemented method of designing an integrated circuit (IC). In this embodiment, layout data describing conductive layers of the integrated circuit on a substrate is generated according to design specification data for the integrated circuit. The conductive layers include a topmost layer of bond pads. Metal structures in the layout data are modified to maximize metal density in a superimposed plane of the conductive layers within a threshold volume under each of the bond pads. A description of the layout data is generated on one or more masks for manufacturing the integrated circuit. By maximizing metal density in the superimposed plane, vertical channels through the dielectric material in the interconnect are reduced or eliminated. Thus, alpha particles cannot readily penetrate the interconnect and reach the underlying semiconductor substrate, reducing soft errors, such as single event upsets in memory cells.

19 Claims, 4 Drawing Sheets

METHOD AND APPARATUS FOR INTERCONNECT LAYOUT IN AN INTEGRATED CIRCUIT

FIELD OF THE INVENTION

An embodiment of the present invention relates generally to semiconductor devices and, more particularly, to a method and apparatus for interconnect layout in an integrated circuit (IC).

BACKGROUND

Integrated circuits (ICs) fabricated using complementary metal oxide semiconductor (CMOS) technologies are susceptible to alpha particles. Alpha particles may cause single event upsets or soft errors during operation of the IC. In particular, alpha particles can cause ionizing radiation when passing through semiconductor device junctions. The ionizing radiation can upset or flip the state of various semiconductor structures, such as a memory cell (e.g., static random access memory (SRAM) cell, such as a conventional 6-transistor or 6T-SRAM). A common source of alpha particles is the bump material used in assembling, packaging, and/or mounting ICs. For example, the Controlled-Collapse Chip Connection (C4) packaging technology utilizes solder bumps deposited on solder wettable metal terminals of the IC and a matching footprint of solder wettable terminals on a substrate. The solder typically includes approximately 95% to 97% by weight of lead (Pb), with the remainder being made up by tin (Sn), although other materials and percentages of materials can be employed. In general, the most common material used for bumps is lead or a lead alloy. As is well known in the art, lead is a source of alpha particles. Alpha particles from solder bumps can penetrate through the interconnect layer of an IC and reach the underlying semiconductor structures, potentially causing the aforementioned single event upsets.

In a typical pad layout of an IC (i.e., the layout of the solder wettable terminals for the solder balls), the underlying metal layers do not follow a specific pattern. Thus, the interconnect of an IC can include large coincident spaces in the metal on several layers. In this manner, vertical channels can exist through the interconnect in which alpha particles can penetrate to underlying semiconductor structures.

Accordingly, there exists a need in the art for a method and apparatus for interconnect layout in an integrated circuit (IC) that overcomes the aforementioned disadvantages.

SUMMARY

An embodiment of the invention relates to a computer-implemented method of designing an integrated circuit. In this embodiment, layout data describing conductive layers of the integrated circuit on a substrate is generated according to design specification data for the integrated circuit. The conductive layers include a topmost layer of bond pads. Metal structures in the layout data are modified to maximize metal density in a superimposed plane of the conductive layers within a threshold volume under each of the bond pads. A description of the layout data is generated on one or more masks for manufacturing the integrated circuit.

Another embodiment of the invention relates to an apparatus for designing an integrated circuit. In this embodiment, the apparatus includes means for generating layout data describing conductive layers of the integrated circuit on a substrate according to design specification data for the integrated circuit, where the conductive layers include a topmost layer of bond pads. The apparatus further includes means for modifying metal structures in the layout data to maximize metal density in a superimposed plane of the conductive layers within a threshold volume under each of the bond pads; and also means for generating a description of the layout data on one or more masks for manufacturing the integrated circuit.

Yet another embodiment of the invention relates to a computer readable medium having instructions stored thereon that when executed by a processor cause the processor to perform a method of designing an integrated circuit. In this embodiment, the method includes generating layout data describing conductive layers of the integrated circuit on a substrate according to design specification data for the integrated circuit, where the conductive layers include a topmost layer of bond pads. In addition, the method includes modifying metal structures in the layout data to maximize metal density in a superimposed plane of the conductive layers within a threshold volume under each of the bond pads; and also generating a description of the layout data on one or more masks for manufacturing the integrated circuit.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Method and apparatus for interconnect layout in an integrated circuit (IC) is described. In some embodiments, a layout of an IC is produced such that the amount of alpha particle blocking material between the solder bump bond pad and the underlying semiconductor structures is maximized. The interconnect of an IC includes various layers of metallization in particular patterns. The metal may include copper (Cu), Aluminum (Al), and the like. Such metals are capable of blocking alpha particles. Specific placement of metal conductors and vias throughout the layers of interconnect (e.g., beneath the bond pads) can be made to maximize the amount of metal through the establishment of rules used by layout and layout verification software. The rules work to ensure that the metal in the interconnect is more uniform and has little or no vertical channels through which alpha particles can penetrate. By blocking alpha particles from reaching the active semiconductor regions of the IC, the invention advantageously reduces soft errors, such as single event upsets in memory cells. These and further aspects of the invention may be understood with reference to the following drawings.

Figure 1:
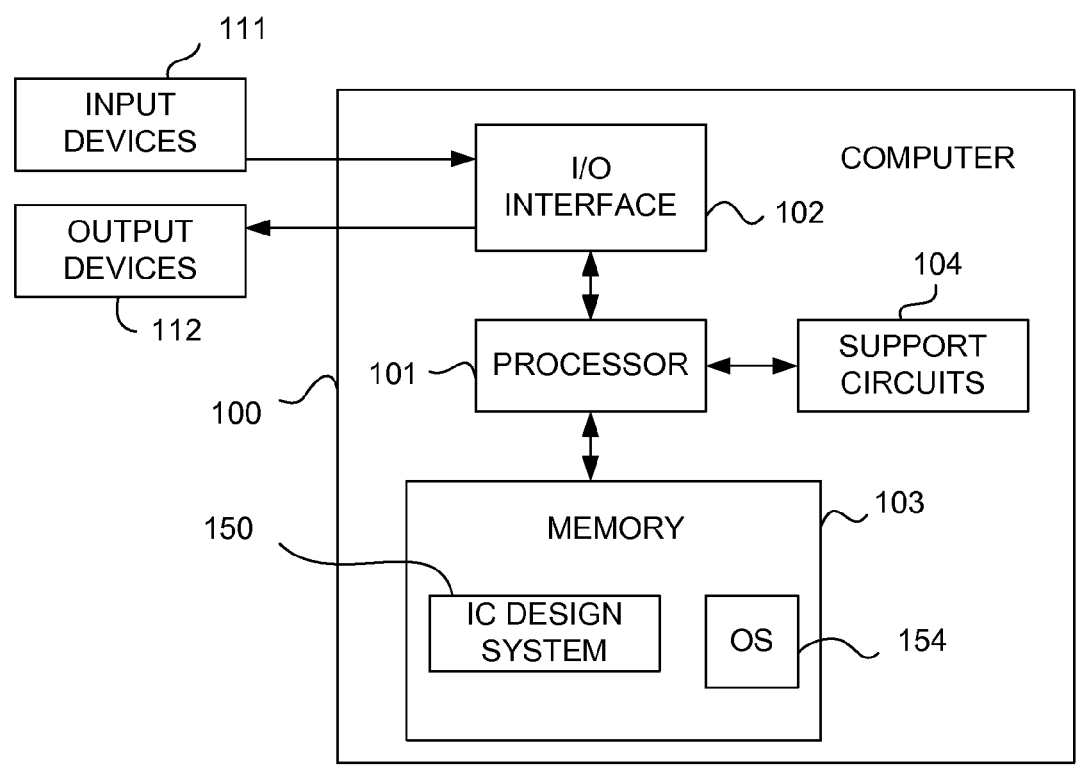
FIG. 1 is a block diagram depicting an exemplary embodiment a computer suitable for implementing the processes described herein in accordance with one or more aspects of the invention.

FIG. 1 is a block diagram depicting an exemplary embodiment a computer 100 suitable for implementing the processes described herein in accordance with one or more aspects of the invention. The computer 100 includes a processor 101, a memory 103, various support circuits 104, and an I/O interface 102. The processor 101 may include one or more microprocessors known in the art. The support circuits 104 for the processor 101 include conventional cache, power supplies, clock circuits, data registers, I/O interfaces, and the like. The I/O interface 112 may be directly coupled to the memory 103 or coupled through the processor 101. The I/O interface 102 is coupled to various input devices 111 (e.g., keyboard, mouse, and the like) and output devices 112 (e.g., display, printer, and the like).

The memory 103 may store processor-executable instructions and/or data that may be executed by and/or used by the processor 101. These processor-executable instructions may comprise hardware, firmware, software, and the like, or some combination thereof. Modules having processor-executable instructions that are stored in the memory 103 include an integrated circuit (IC) design system 150. The computer 100 may be programmed with an operating system 154, which may be any type of operating system known in the art. At least a portion of an operating system 154 may be disposed in the memory 103. The memory 103 may include one or more of the following random access memory, read only memory, magneto-resistive read/write memory, optical read/write memory, cache memory, magnetic read/write memory, and the like, as well as computer readable media as described below.

An aspect of the invention is implemented as a program product for use with a computer system. Program(s) of the program product defines functions of embodiments and can be contained on a variety of computer readable media, which include, for example: (i) information permanently stored on non-writable storage media (e.g., read-only memory devices within a computer such as CD-ROM or DVD-ROM disks readable by a CD-ROM drive or a DVD drive); and (ii) alterable information stored on writable storage media (e.g., floppy disks within a diskette drive or hard-disk drive or read/writable CD or read/writable DVD). Such computer readable media, when carrying computer-readable instructions that direct functions of the invention, represent one or more embodiments of the invention.

Figure 2:
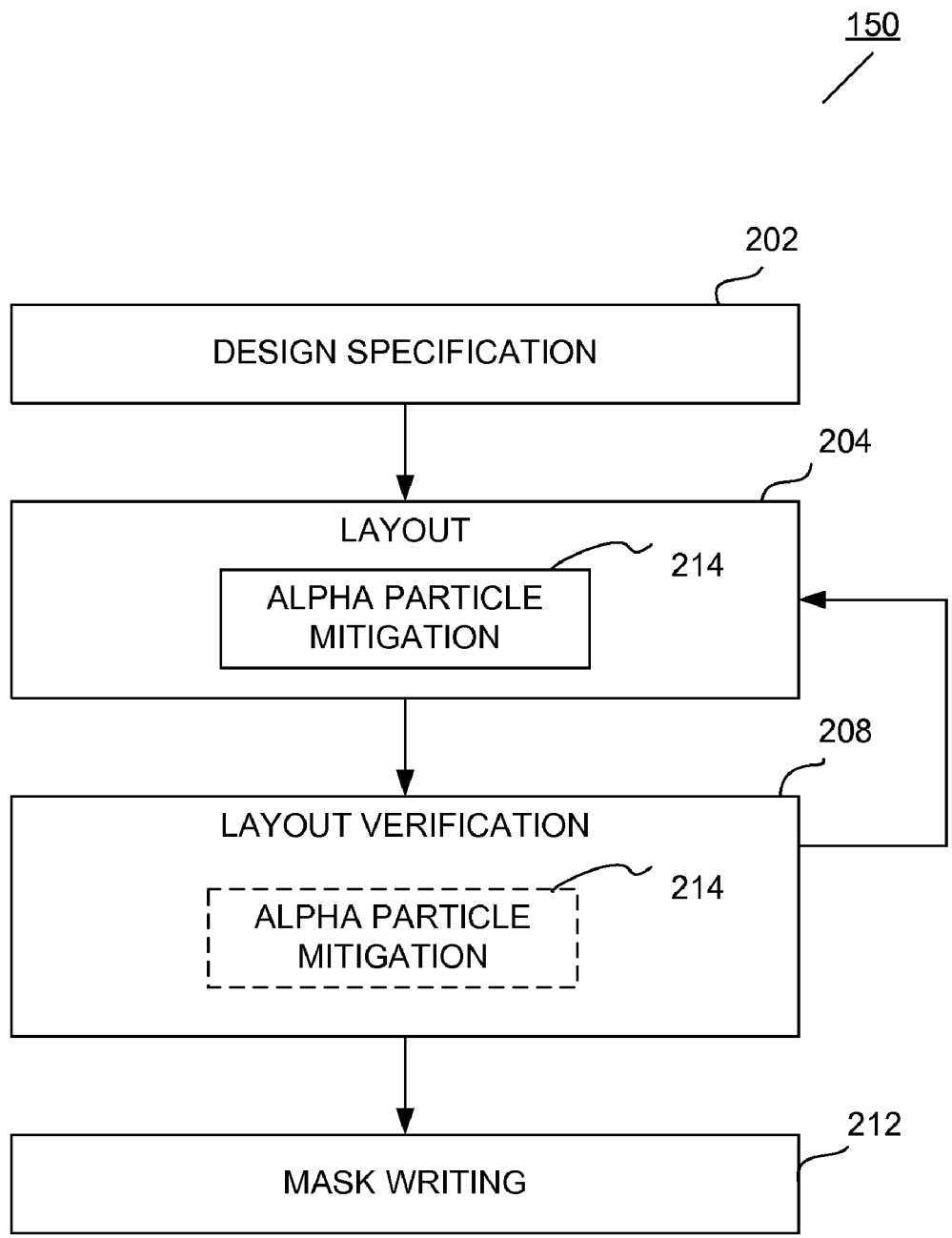
FIG. 2 is a block diagram depicting an exemplary embodiment of an IC design system in accordance with one or more aspects of the invention.

FIG. 2 is a block diagram depicting an exemplary embodiment of an IC design system 150 in accordance with one or more aspects of the invention. The system 150 includes a design specification module 202, a layout module 204, a layout verification module 208, and a mask writing module 212. The design specification module 202 is configured to establish a set of specifications of an IC design and produce a transistor-level and/or gate-level description of the design. The specifications typically describe the expected functionality of the design and may define values for various parameters, such as maximum allowable delay times, setup and hold time, operation frequency, operation conditions, silicon area constraints, power dissipation constraints, and the like. The design specification module 202 may provide a schematic editor or other type of editor that allows a designer to draw, place, and connect individual circuit components to generate the transistor-level and/or gate-level description, referred to as a netlist.

The layout module 204 generates layout data for the design in response to the netlist. The layout data describes geometries and relative positioning of mask layers (layers) to be used in actual fabrication of circuitry and conductive interconnect for the integrated circuit. The layout data also includes cells, which define sets of particular devices within the integrated circuit. Cells typically contain all the polygons on all the layers required for the fabrication of the respective devices. Cells can be nested within other cells, often in very intricate arrangements. The structure of cells provides a hierarchy. Typical formats for the polygons of the layout data are GDS II (Graphic Design System II) or CIF (Caltech Intermediate Format).

The layout verification module 208 is configured to process the layout data from the layout module 204. Once the layout module 204 creates a layout, the layout verification module 208 verifies the layout. Verification includes ensuring that the transformation from netlist to layout has been properly executed and that the layout created adheres to certain geometric design rules. Such layout verification operations are often referred to as layout versus schematic (LVS) and design rule check (DRC) operations. If the layout verification module 208 detects errors in the layout data, the layout module 204 may be invoked to modify the layout data to correct the errors. In some cases, the errors are such that the design specification module 202 must be invoked to modify the design. The mask writing module 212 generates a description of the layout data on masks for manufacturing of ICs.

The layout module 204 may be invoked by a user to perform a manual layout, may generate a layout automatically from the netlist, or a combination of both. The layout module 204 may invoke various layout rules when producing the layout (either automatically applied or via notification to the user). In some embodiments, layout rules implemented by the layout module 204 include rules that maximize the amount of metal under a bond pad on which a solder bump will be fabricated ("alpha particle mitigation" rules). The alpha particle mitigation rules work to prevent formation of vertical channels through the interconnect in which there is little or no metal to block alpha particles. In some embodiments, the rules may also be implemented as requirements in the layout verification module 208. That is, the layout verification module 208 can enforce the alpha particle mitigation rules in combination with other known rules to verify the layout. Thus, an alpha particle mitigation sub-module 214 can be implemented in the layout module 204, the layout verification module 208, or both, in order to invoke and enforce the alpha particle mitigation rules and requirements described herein. Those skilled in the art will appreciate that the alpha particle mitigation sub-module 214 may also be implemented as a stand-alone module along with the layout module 204 and the layout verification module 208.

In some embodiments, the alpha particle mitigation sub-module 214 can implement the following rules and/or requirements or any combination thereof.

(1) The vias on one or more interconnect layers can be filled to maximum density allowed by the manufacturing technology. That is, a rule/requirement can place vias on one or more interconnect layers such that the super-position of the vias leaves little or no vertical channels.

(2) Dummy metal structures (e.g., fills) can be added to reduce metal spacings on one or more interconnect layers to a minimum threshold (e.g., as allowed by technology).

(3) Dimensions of metal structures can be adjusted (e.g., widths, lengths) to reduce metal spacings on one or more interconnect layers to a minimum threshold.

(4) Prohibit via "stacking", i.e., the vertical alignment of vias one two or more interconnect layers. Rather, as in (1) above, vias can be offset from one layer to the next to maximize via density.

It is to be understood that there are many possible metal conductor/via layouts across the interconnect layers. Thus, additional rules/requirements can be generated such that metal density across interconnect layers is maximized within technology constraints in order to reduce or eliminate vertical channels through which alpha particles can penetrate to the semiconductor structures.

Figure 3:
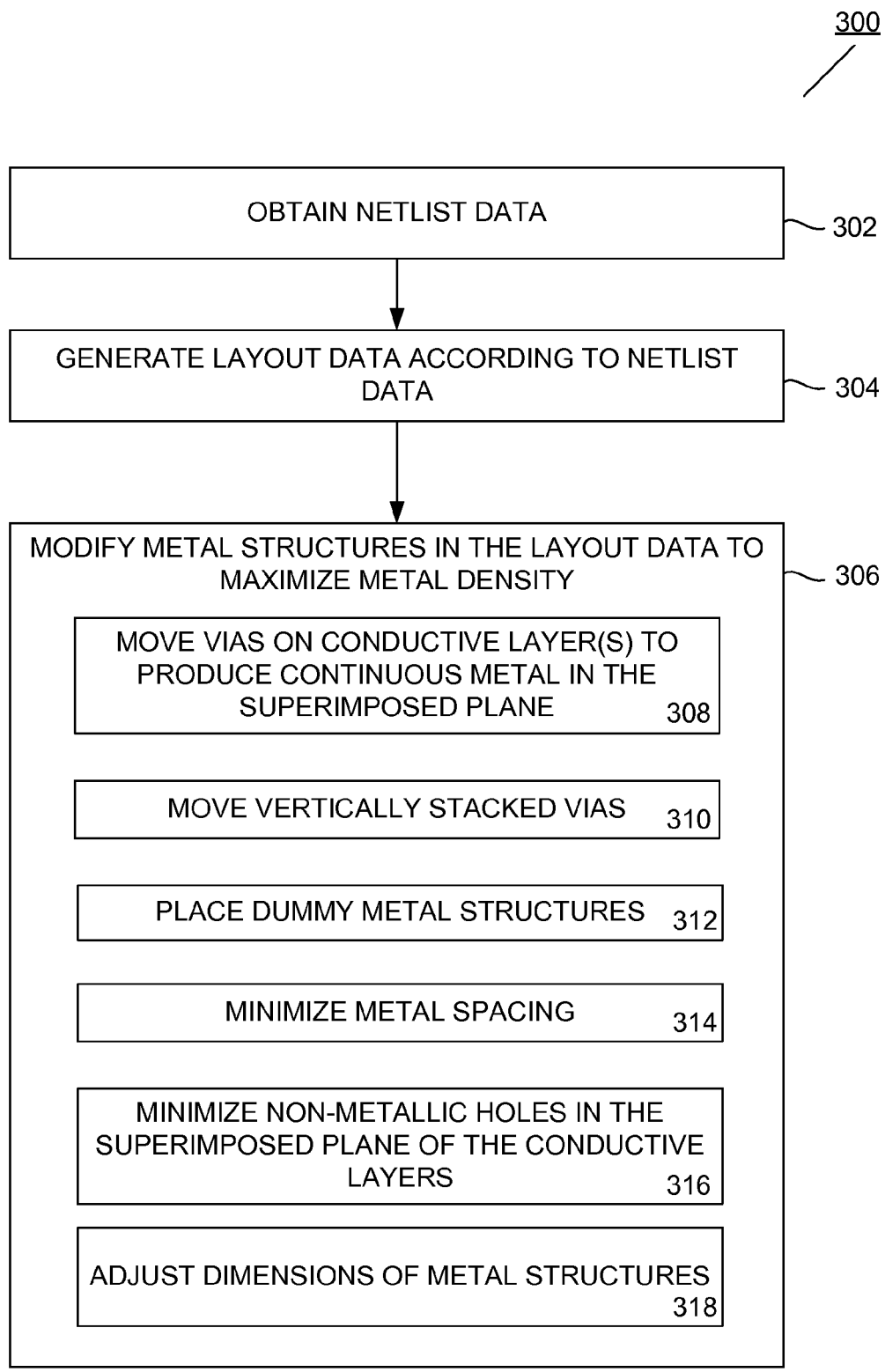
FIG. 3 is a flow diagram depicting a method of designing an IC according to some embodiments of the invention.

FIG. 3 is a flow diagram depicting a method 300 of designing an IC according to some embodiments of the invention. The method 300 may be performed by the IC design system 150. For example, the method 300 may be performed by the layout module 204, the layout verification module 206, or both, in order to implement the alpha particle sub-module 214. Alternatively, the method 300 may be performed by a separate module or in combination with one or more of the layout module 204 and/or the layout verification module 206, as noted above.

The method 300 begins at step 302, where netlist data providing a design specification for an IC is obtained. At step 304, layout data describing conductive layers of the IC on a substrate is generated according to the design specification in the netlist data. At step 306, metal structures in the layout data are modified to maximize metal density in a superimposed plane of the conductive layers within a threshold volume under each bond pad. That is, the metal structures are modified below each bond pad within a threshold region, referred to as a threshold volume. The metal structures are modified on one or more of the conductive layers to minimize vertical channels that extend to the substrate. Thus, if all of the conductive layers are superimposed on the substrate (referred to as the superimposed plane), then ideally the superposition of the metal results in a continuous metal sheet. Any non-metallic holes in the superimposed plane would indicate the presence of a vertical channel extending through the conductive layers to the substrate. Thus, at step 306, the layout is modified in order to maximize metal density in the superimposed plane. Stated differently, the layout data is modified in order to minimize non-metallic holes in the superimposed plane. While steps 304 and 306 are described as separate sequential steps, it is to be understood that such steps may be performed contemporaneously during generation of layout data.

Step 306 may include one or more sub-steps as follows. At step 308, vias on one or more conductive layers are moved to produce continuous metal in the superimposed plane of the conductive layers within the threshold volume of each bond pad. That is, vias can be offset from one another in a manner that minimizes vertical channels in the interconnect. At step 310, each via in the conductive layers that is vertically stacked above or below another via in the conductive layers is moved within the threshold volume of each bond pad. By staggering vias, vertical channels can be minimized. At step 312, dummy metal structures can be placed on one or more conductive layers within the threshold volume of each bond pad. A "dummy metal structure" is metal that is formed on a layer, but not used in the electrical specification of the IC. Dummy metal structures can be selectively placed to reduce or eliminate vertical channels. At step 314, spacing between metal structures in one or more conductive layers is minimized within the threshold volume of each bond pad. The minimizing of metal spacing must remain within the technology constraints. At step 316, metal structures can be placed on one or more conductive layers to minimize non-metallic holes in the superimposed plane of the conductive layers within the threshold volume of each bond pad. While minimizing non-metallic holes in the superimposed plane achieves the same result as maximizing metal density in the superimposed plane, the two operations may be algorithmically different and one may be more efficient than the other given particular layouts. At step 318, dimensions of metal structures on one or more of the conductive layers are adjusted within the threshold volume of each bond pad.

Figure 4:
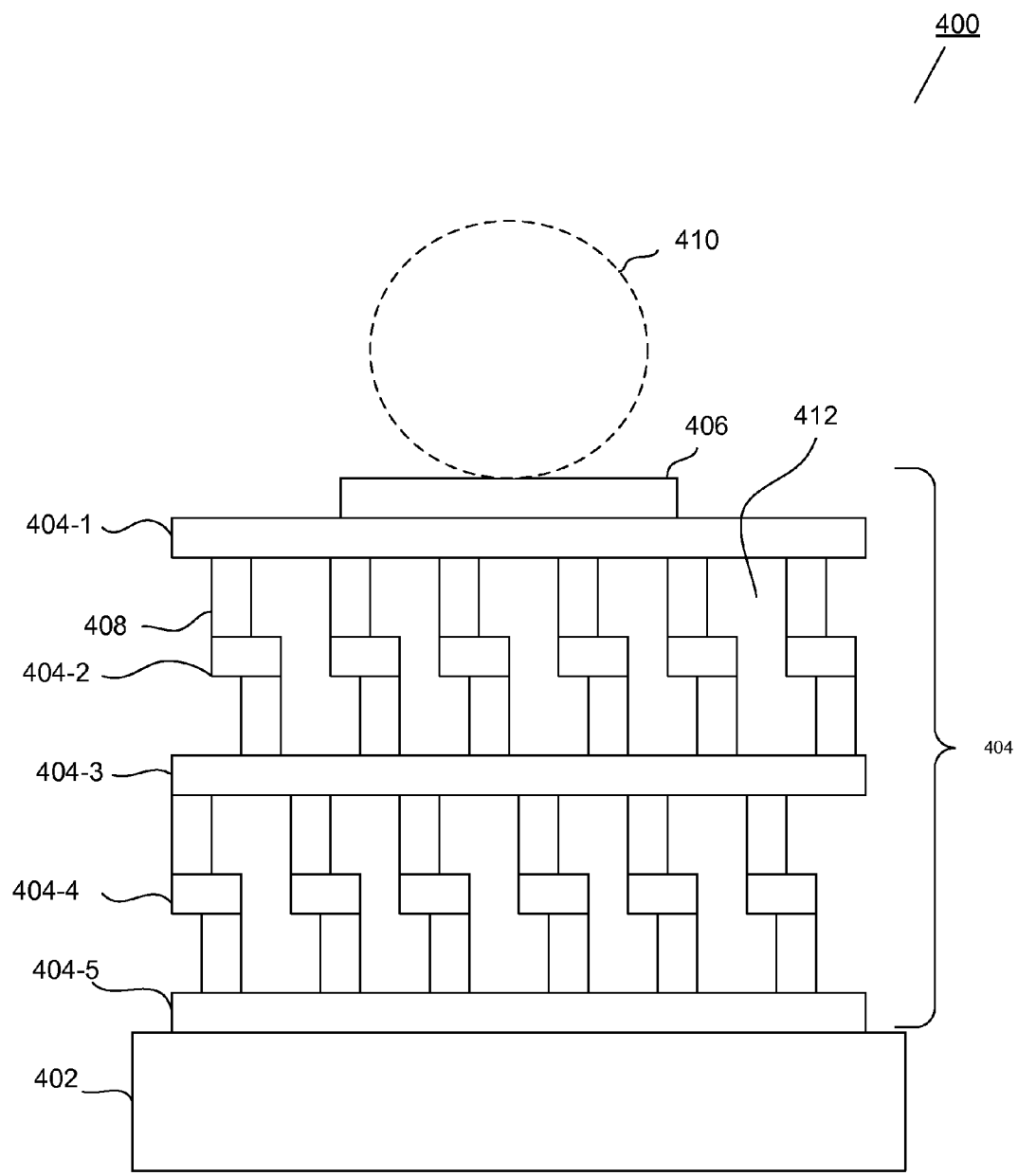
FIG. 4 is a cross-section of an exemplary layout of an IC.

FIG. 4 is a cross-section of an exemplary layout 400. The layout 400 includes a substrate 402 and interconnect 404. The interconnect 404 includes five layers 404-1 through 404-5 separated by dielectric material 412. It is to be understood that the interconnect 404 could have more or less conductive layers, e.g., practical ICs can have many more layers (e.g., 12 or more layers). A bond pad 406 is shown as part of a top-most conductive layer of the interconnect 404. The bond pad 406 is configured to support a solder ball 410. The portion of the interconnect 404 shown in the layout 400 can be considered as the threshold volume associated with the bond pad 406. Thus, metal structures within the threshold volume are arranged in order to maximize metal density in the superimposition of the conductive layers 404-1 through 404-5 in order to block alpha particles emitted by the solder ball 410.

In particular, the interconnect 404 further includes vias 408 interconnecting different ones of the conductive layers 404-1 through 404-5. As shown in this example, the vias 408 are staggered in that no one via 408 is vertically aligned with another via 408. By staggering the vias 408, there are no vertical channels between the bond pad 406 and the substrate 402 through the dielectric material 412 of the interconnect stack 404. Thus, pathways through which alpha particles can readily penetrate are eliminated in the threshold volume of the bond pad 406. It is to be understood that the arrangement of the interconnect 404 shown in FIG. 4 is merely illustrative. Practical layouts may have different, more complex arrangements of metal structures, but the principle shown in FIG. 4 remains the same. That is, the metal structures can be arranged to reduce or eliminate vertical channels in the dielectrics through which alpha particles can readily penetrate and reach the substrate.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of designing an integrated circuit, comprising:
generating, using a processor, layout data describing conductive layers of the integrated circuit on a substrate according to design specification data for the integrated circuit, the conductive layers including a topmost layer of bond pads;
modifying metal structures in the layout data to maximize metal density in a superimposed plane of the conductive layers within a threshold volume under each of the bond pads, wherein a material on the bond pads produces alpha particles, and a plurality of vias are staggered such that there are no vertical channels through which the alpha particles can reach the substrate; and
generating a description of the layout data on one or more masks for manufacturing the integrated circuit.

2. The method of claim 1, wherein the modifying comprises:
moving, for each of the bond pads, vias on one or more of the conductive layers to produce continuous metal in the superimposed plane of the conductive layers within the threshold volume.

3. The method of claim 1, wherein the modifying comprises:
moving, for each of the bond pads, each via in the conductive layers that is vertically stacked above or below another via in the conductive layers within the threshold volume.

4. The method of claim 1, wherein the modifying comprises:
placing, for each of the bond pads, dummy metal structures on one or more of the conductive layers within the threshold volume.

5. The method of claim 1, wherein the modifying comprises:
minimizing, for each of the bond pads, spacing between metal structures in one or more of the conductive layers within the threshold volume.

6. The method of claim 1, wherein the modifying comprises:
moving or placing, for each of the bond pads, metal structures on one or more of the conductive layers to minimize non-metallic holes in the superimposed plane of the conductive layers within the threshold volume.

7. The method of claim 1, wherein the modifying comprises:
adjusting, for each of the bond pads, dimensions of metal structures on one or more of the conductive layers within the threshold volume.

8. A non-transitory computer readable medium having instructions stored thereon that when executed by a processor cause the processor to perform a method of designing an integrated circuit, comprising:
generating layout data describing conductive layers of the integrated circuit on a substrate according to design specification data for the integrated circuit, the conductive layers including a topmost layer of bond pads;
modifying metal structures in the layout data to maximize metal density in a superimposed plane of the conductive layers within a threshold volume under each of the bond pads, wherein a plurality of vias are staggered such that there are no vertical channels through which alpha particles produced by a material on the bond pads can reach the substrate; and
generating a description of the layout data on one or more masks for manufacturing the integrated circuit.

9. The computer readable medium of claim 8, wherein the modifying comprises:
moving, for each of the bond pads, vias on one or more of the conductive layers to produce continuous metal in the superimposed plane of the conductive layers within the threshold volume.

10. The computer readable medium of claim 8, wherein the modifying comprises:
moving, for each of the bond pads, each via in the conductive layers that is vertically stacked above or below another via in the conductive layers within the threshold volume.

11. The computer readable medium of claim 8, wherein the modifying comprises:
placing, for each of the bond pads, dummy metal structures on one or more of the conductive layers within the threshold volume.

12. The computer readable medium of claim 8, wherein the modifying comprises:
minimizing, for each of the bond pads, spacing between metal structures in one or more of the conductive layers within the threshold volume.

13. The computer readable medium of claim 8, wherein the modifying comprises:
adjusting, for each of the bond pads, dimensions of metal structures on one or more of the conductive layers within the threshold volume.

14. A semiconductor device, comprising:
a substrate;
an interconnect stack on the substrate, the interconnect stack having conductive layers according to design specification data, the conductive layers including a topmost layer of bond pads, wherein the interconnect stack includes a plurality of vias; and
a material on the bond pads of the interconnect stack, wherein the material produces alpha particles,
wherein, for each of the bond pads, the interconnect stack is implemented to maximize metal density in a superimposed plane of the conductive layers within a threshold volume under the bond pad, and the plurality of vias are staggered such that there are no vertical channels through which the alpha particles can reach the substrate.

15. The semiconductor device of claim 14, wherein the interconnect stack further comprises:
a first layer on the substrate;
a first subset of the plurality of vias on the first layer;
a second layer on the first subset of the plurality of vias;
a second subset of the plurality of vias on the second layer; and
a third layer on the second subset of the plurality of vias.

16. The semiconductor device of claim 15, wherein the interconnect stack further comprises:
a third subset of the plurality of vias on the third layer;
a fourth layer on the third subset of the plurality of vias;
a fourth subset of the plurality of vias on the fourth layer;
a fifth layer on the fourth subset of the plurality of vias;
a bond pad on the fifth layer; and
a dielectric material between the first layer, the first subset of the plurality of vias, the second layer, the second subset of the plurality of vias, the third layer, the third subset of the plurality of vias, the fourth layer, the fourth subset of the plurality of vias, and the fifth layer,
wherein the material is on the bond pad.

17. The semiconductor device of claim 16, wherein the first subset of the plurality of vias, the second subset of the plurality of vias, the third subset of the plurality of vias, and the fourth subset of the plurality of vias are staggered such that there are no vertical channels in the dielectric material through which the alpha particles can reach the substrate.

18. The semiconductor device of claim 16, wherein the first subset of the plurality of vias, the second subset of the plurality of vias, the third subset of the plurality of vias, and the fourth subset of the plurality of vias are staggered such that none of the plurality of vias is vertically aligned with another one of the plurality of vias.

19. The semiconductor device of claim 14, wherein the material is a solder ball.

* * * * *